United States Patent
Chen et al.

(10) Patent No.: US 9,497,881 B2
(45) Date of Patent: Nov. 15, 2016

(54) SERVER CABINET STRUCTURE

(71) Applicant: Quanta Computer Inc., Taoyuan Shien (TW)

(72) Inventors: Chao-Jung Chen, New Taipei (TW); Yaw-Tzorng Tsorng, Taipei (TW); Mao-Chao Yang, Taoyuan County (TW); Yung-Shiang Lin, New Taipei (TW)

(73) Assignee: QUANTA COMPUTER INC., Guishan Dist. Taoyuan (TW)

( * ) Notice: Subject to any disclaimer, the term of this patent is extended or adjusted under 35 U.S.C. 154(b) by 23 days.

(21) Appl. No.: 14/513,286

(22) Filed: Oct. 14, 2014

(65) Prior Publication Data

US 2016/0021778 A1 Jan. 21, 2016

(30) Foreign Application Priority Data

Jul. 16, 2014 (TW) .............................. 103124396 A

(51) Int. Cl.
*H05K 7/00* (2006.01)
*H05K 7/14* (2006.01)

(52) U.S. Cl.
CPC .................................. *H05K 7/1487* (2013.01)

(58) Field of Classification Search
None
See application file for complete search history.

(56) References Cited

U.S. PATENT DOCUMENTS

| | | | | |
|---|---|---|---|---|
| 6,142,590 A * | 11/2000 | Harwell | ............... | H05K 7/1494 312/208.1 |
| 6,600,656 B1 * | 7/2003 | Mori | ................... | H05K 7/1421 174/168 |
| 6,788,542 B2 * | 9/2004 | Rumney | ............... | H05K 7/1425 361/724 |
| 6,788,544 B1 * | 9/2004 | Barsun | ................. | H05K 7/1421 361/727 |
| 7,269,020 B2 * | 9/2007 | Wang | ................... | H05K 5/0239 312/223.2 |
| 7,724,543 B2 * | 5/2010 | Ozawa | ..................... | H04Q 1/02 361/729 |
| 7,813,136 B2 * | 10/2010 | Liu | .......................... | G06F 1/18 361/679.02 |
| 7,911,788 B2 * | 3/2011 | Sasagawa | ................ | G06F 1/20 165/104.34 |
| 8,154,859 B2 * | 4/2012 | Shahrokhi | .............. | F16G 13/16 248/317 |
| 8,416,565 B1 * | 4/2013 | Ross | .................... | H05K 7/1492 248/551 |
| 8,437,123 B2 * | 5/2013 | Sun | ...................... | H05K 7/1489 312/311 |
| 9,055,689 B2 * | 6/2015 | Yu | ......................... | H05K 5/0226 |
| 2001/0037985 A1 * | 11/2001 | Varghese | ............. | A47B 88/044 211/26 |
| 2005/0157461 A1 * | 7/2005 | Cauthron | ............. | H05K 7/1488 361/724 |
| 2009/0219701 A1 * | 9/2009 | Wu | ...................... | H05K 7/1494 361/727 |
| 2010/0007252 A1 * | 1/2010 | Liu | ..................... | H05K 7/1487 312/223.2 |
| 2011/0133559 A1 * | 6/2011 | Yamashita | ................ | G06F 1/30 307/66 |

FOREIGN PATENT DOCUMENTS

| | | |
|---|---|---|
| TW | M270611 | 7/2005 |
| TW | M351584 | 2/2009 |
| TW | M406907 | 7/2011 |
| TW | M441992 | 11/2012 |
| TW | M445710 | 1/2013 |
| TW | M470490 | 1/2014 |

* cited by examiner

Primary Examiner — Courtney Smith
Assistant Examiner — Rashen E Morrison
(74) Attorney, Agent, or Firm — McClure, Qualey & Rodack, LLP

(57) ABSTRACT

The disclosure provides a server including a chassis, a cabinet, and a plurality of superstructures. The chassis has an accommodating space. The cabinet is slidably connected to the chassis so as to slide in or slide out the accommodating space. The cabinet has an opening and a receiving hole communicated to each other, and the receiving hole is configured to accommodate at least one storage device. Each of the superstructures is rotatably connected to the cabinet so as to cover or open a part of the opening.

10 Claims, 5 Drawing Sheets

SERVER CABINET STRUCTURE

RELATED APPLICATIONS

This application claims priority to Taiwan Application Serial Number 103124396, filed Jul. 16, 2014, which is herein incorporated by reference.

BACKGROUND

Technical Field

The present disclosure relates to a server. More particularly, the present disclosure relates to a server having a chassis.

Description of Related Art

A server commonly has a chassis and a cabinet. The cabinet can be drawn out or received relative to the chassis. The cabinet has a superstructure configured to be opened in case the exchange of a hard disk is required. In order to protect the server from electromagnetic radiation, the cabinet and the superstructure should be made of metal. On the other hand, as to heat dissipation, the server requires specific air intake holes, but no gap is allowed in the superstructure, such that air flow is forced to pass through the air intake holes so as to increase thermal convection.

Because the superstructure needs to meet both the requirements of electromagnetic radiation protection and heat dissipation, the superstructure of the server is designed as a metal sheet. It takes extra efforts that the whole cabinet needs to be drawn out in order to lift the superstructure. Further, the superstructure needs to remove after lifted because there is no supporting for the superstructure. However, the superstructure is made of metal and heavy, and no space to accommodate the superstructure. Consequently, it is inconvenient to maintain the server.

Accordingly, it is important to design a server, in which the superstructure can cover a cabinet of the server tightly, as well as the cabinet needs not to be entirely drawn out in the maintenance of the server.

SUMMARY

The disclosure provides a server including a chassis, a cabinet, and a plurality of superstructures. The chassis has an accommodating space. The cabinet is slidably connected to the chassis so as to slide in or slide out the accommodating space. The cabinet has an opening and a receiving hole communicated to each other, and the receiving hole is configured to accommodate at least one storage device. Each of the superstructures is rotatably connected to the cabinet so as to cover or open a part of the opening.

In an embodiment of the present disclosure, the server includes a plurality of connecting rods. Each of the connecting rods has a first end and a second end, and the first end and the second end are respectively pivotally connected to the corresponding superstructure and the cabinet.

In an embodiment of the present disclosure, each of the superstructures includes: a side board and a top board. The side board is pivotally connected to the first end of the corresponding connecting rod. The top board is connected to the side board and is bent relative to the side board so as to cover or open a part of the opening.

In an embodiment of the present disclosure, the side board includes a first stopping portion. When the top board covers the opening, a first angle formed between the top board and the connecting rod. When the top board rotates relative to the connecting rod until the first stopping portion abuts against the connecting rod, a second angle is formed between the top board and the connecting rod, and the second angle is greater than the first angle.

In an embodiment of the present disclosure, the top board includes a second stopping portion. The second stopping portion is capable of abutting against the cabinet or the adjacent superstructure so as to make the top board erect relative to the opening.

In an embodiment of the present disclosure, the side board includes a pivotal connecting part and a first main part. The pivotal connecting part is pivotally connected to the first end. The first stopping portion is connected to the pivotal connecting part and is bent relative to the pivotal connecting part toward the cabinet. The first main part is connected to the pivotal connecting part. The pivotal connecting part is located between the first main part and the first stopping portion.

In an embodiment of the present disclosure, the top board includes a second main part and an extending part. The second main part is connected to the first main part and the second stopping portion. The second main part is bent relative to the first main part. The extending part is connected to the second main part. The second main part is located between the second stopping portion and the extending part. The pivotal connecting part includes a pivot, and an axis of the pivot is located between the first stopping portion and the second stopping portion.

In an embodiment of the present disclosure, the server includes a plurality of first latches. Each of the first latches is connected to the cabinet, and each of the superstructures includes a second latch. When any one of the superstructures covers a part of the opening, the second latch and the corresponding first latch are engaged to each other. When the second latch is engaged to the corresponding first latch, the first latch is located between the second latch and the side board.

In an embodiment of the present disclosure, each of the first latches includes a square shaped protrusion extruding toward the accommodating space. Each of the second latches has a square shaped locking groove engaged to the square shaped protrusion.

In an embodiment of the present disclosure, each of the second latches includes a pressing portion. Each of the side board has a pressing hole. The pressing portion is located at the pressing hole. When the pressing portion is pressed through the pressing hole, the second latch moves away from the side board and is disengaged from the first latch.

In an embodiment of the present disclosure, the cabinet has a groove. When the superstructure covers a part of the opening and the pressing portion is pressed, at least a part of the pressing portion passes through the groove and moves into the receiving hole.

Accordingly, when an operator exchanges the storage device, the operator draws out the cabinet and lifts up the superstructures, and the storage device is ready to be exchanged. A conventional superstructure on a cabinet in a server is a metal sheet. The conventional superstructure is heavy, and the operator has to draw out the whole cabinet to take the superstructure out, which is inconvenient. In comparison to the conventional server, the server in the present disclosure is capable for the operator to exchange the storage device. The operator only need to draw out the cabinet to a position of the storage device located at, and lifts up the corresponding superstructures without drawing out the whole cabinet. Therefore, the present disclosure can save the time of repairing so as to minimize labor costs.

Furthermore, in the present disclosure, the thickness of the server is reduced to save space. By pivotally connecting the connecting rod to the superstructure and the cabinet, the fulcrum of the superstructure is moved down. If the fulcrum of superstructure extrudes out of the cabinet, the chassis is need to be larger. Therefore, utilizing the connecting rods to move down the fulcrum of the superstructures to the cabinet can save the space of the server.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
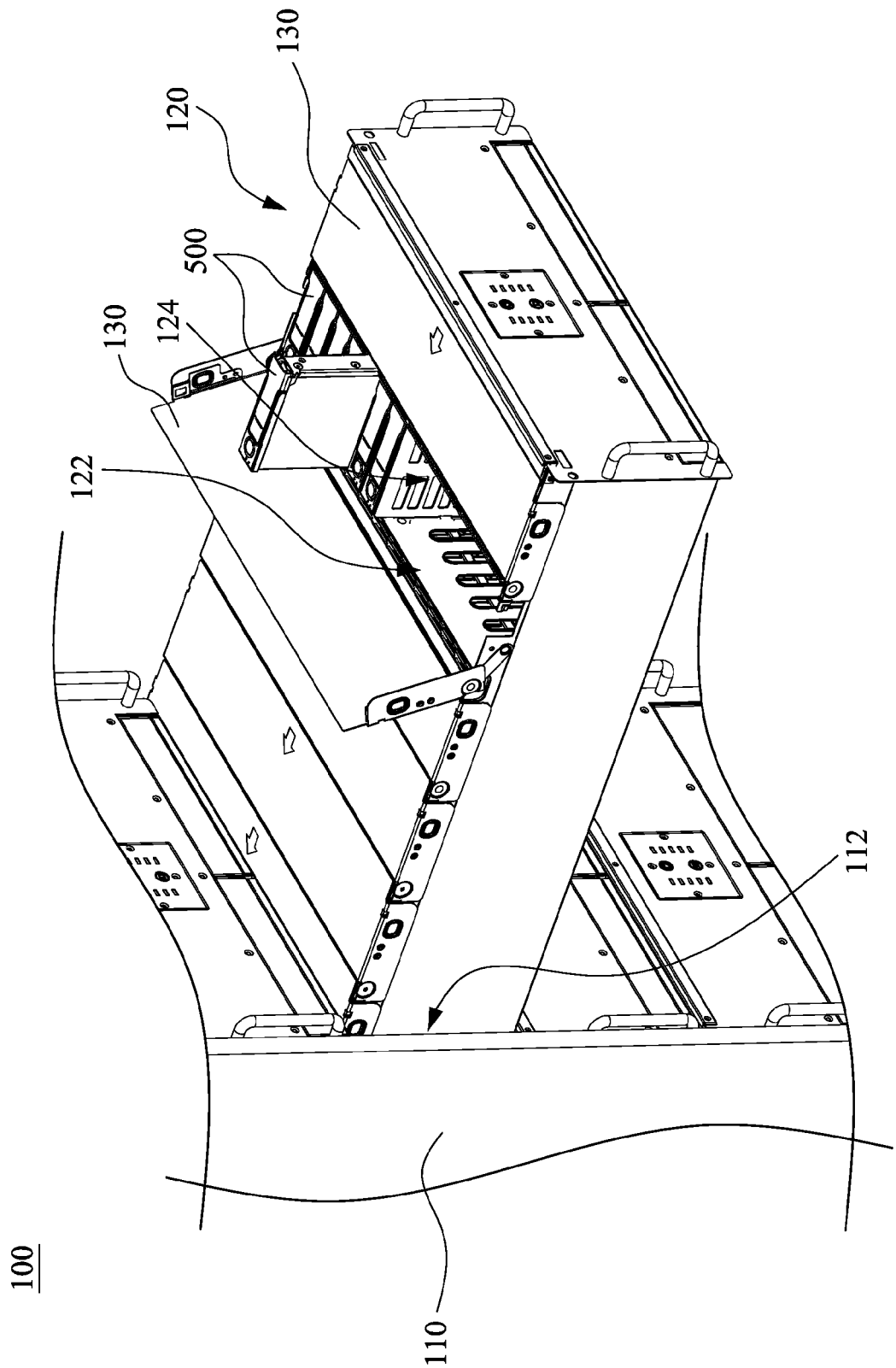
FIG. 1 is a perspective view of a server according to an embodiment of the present disclosure.

The present disclosure can be more fully understood by reading the following detailed description of the embodiment, with reference made to the accompanying drawings. Wherever possible, the same reference numbers are used in the drawings and the description to refer to the same or like parts. However, the embodiments are not provided to limit the scope covered in the present disclosure, and the description of the operation of the structures is not intended to limit the order in which to perform, any structure formed by re-combination of the elements that result in a device with equal effect are all covered in the scope of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
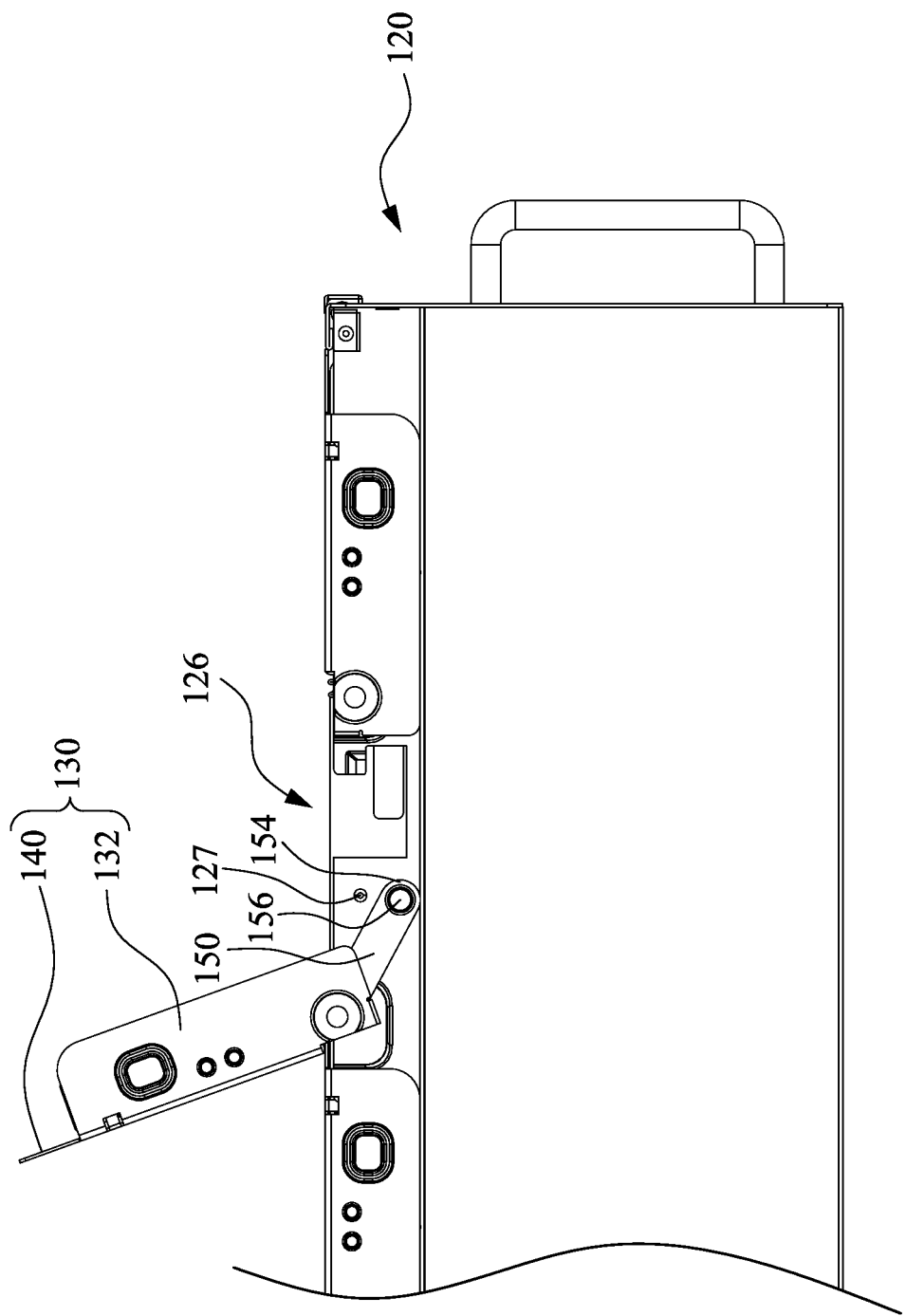
FIG. 2 is a side view of a cabinet and a superstructure according to an embodiment of the present disclosure.

FIG. 1 is a perspective view of a server 100 according to an embodiment of the present disclosure. FIG. 2 is a side view of a cabinet 120 and a superstructure 130 according to an embodiment of the present disclosure.

As shown in FIG. 1 and FIG. 2, the server 100 including a chassis 110, a cabinet 120, and a plurality of superstructures 130. The chassis 110 has an accommodating space 112. The cabinet 120 is slidably connected to the chassis 110 so as to slide in or slide out the accommodating space 112 (i.e., similar to the mechanism of a drawer). The cabinet 120 has an opening 122 and a receiving hole 124 communicated to each other, and the receiving hole 124 is configured to accommodate at least one storage device 500. Each of the superstructures 130 is rotatably connected to the cabinet 120 so as to cover or open a part of the opening 122.

When an operator exchanges the storage device 500, the operator draws out the cabinet 120 and lifts up the superstructures 130, and the storage device 500 is ready to be exchanged. A conventional superstructure on a cabinet in a server is a metal sheet. The conventional superstructure is heavy, and the operator has to draw out the whole cabinet to take the superstructure out, which is inconvenient. In comparison to the conventional server, the server 100 in the present disclosure is capable for the operator to exchange the storage device 500. The operator only need to draw out the cabinet 120 to a position of the storage device 500 located at, and lifts up the corresponding superstructures 130 without drawing out the whole cabinet 120. Therefore, the present disclosure can save the time of repairing so as to minimize labor costs.

Figure 3:
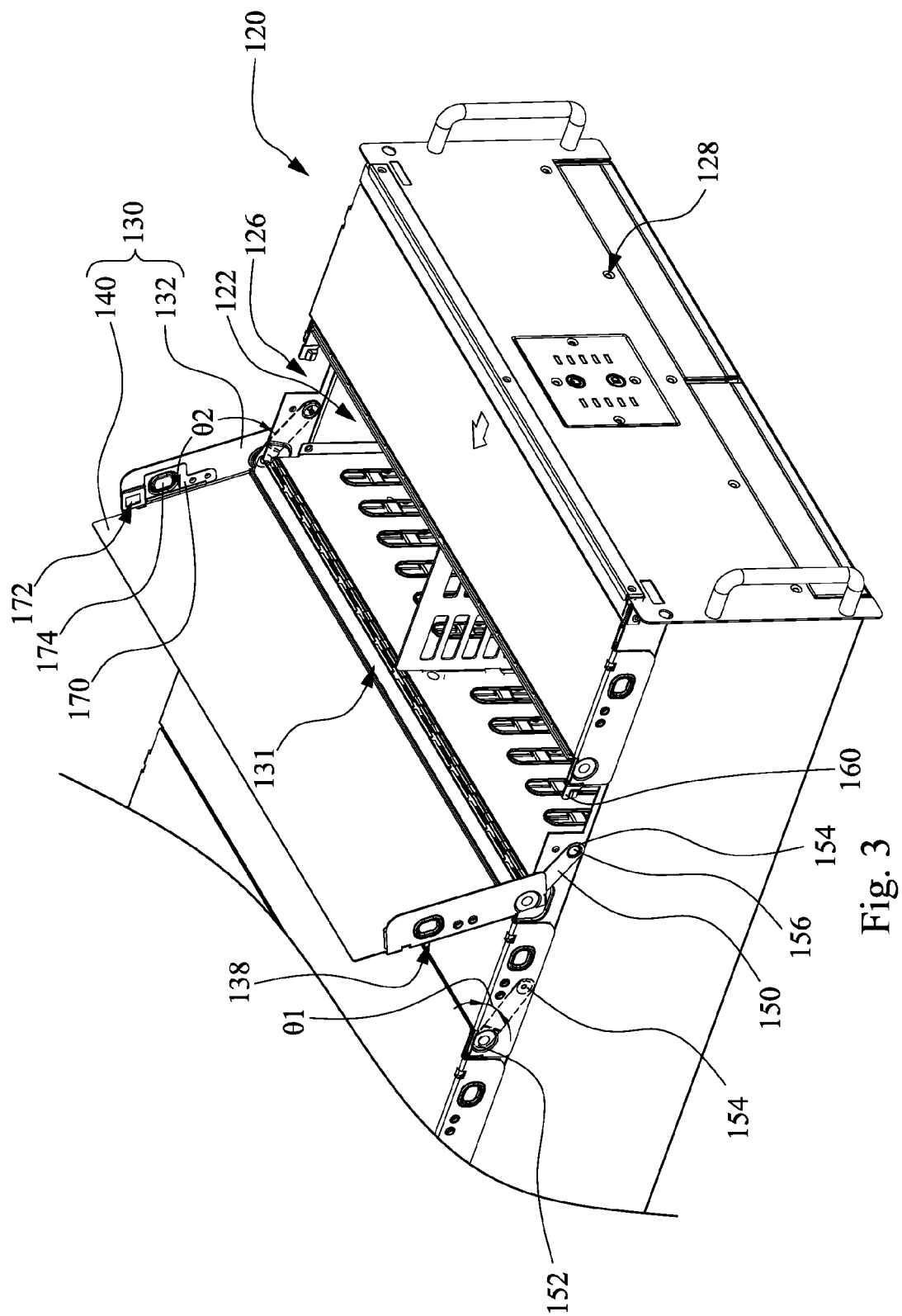
FIG. 3 is a perspective view of the cabinet and the superstructure according to an embodiment of the present disclosure.

FIG. 3 is a perspective view of the cabinet 120 and the superstructures 130 according to an embodiment of the present disclosure.

As shown in FIG. 2 and FIG. 3, the server 100 (see FIG. 1) includes a plurality of connecting rods 150. Each of the connecting rods 150 has a first end 152 and a second end 154, and the first end 152 and the second end 154 are respectively pivotally connected to the corresponding superstructure 130 and the cabinet 120. Each of the superstructures 130 includes: a side board 132 and a top board 140. The side board 132 is pivotally connected to the first end 152 of the corresponding connecting rod 150. The top board 140 is connected to the side board 132 and is bent relative to the side board 132 so as to cover or open a part of the opening 122.

In the present disclosure, the thickness of the server 100 (see FIG. 1) is reduced to save space. By pivotally connecting the connecting rod 150 to the superstructure 130 and the cabinet 120, the fulcrum of the superstructure 130 is moved down (in the present disclosure, the fulcrum of the superstructure 130 is the pivot 156 of the second end 154 of the connecting rod 150). If the fulcrum of superstructure 130 extrudes out of the cabinet 120, the chassis 110 (see FIG. 1) is need to be larger. Therefore, utilizing the connecting rods 150 to move down the fulcrum of the superstructures 130 to the cabinet 120 can save the space of the chassis 110 (see FIG. 1).

The cabinet 120 further includes a convex bump 127 located near the connecting rod 150. When operator covers the superstructure 130, owing to the convex bump 127, the connecting rod 150 is restricted to rotate away from the opening 122. Therefore, the superstructure 130 can cover at a right position.

Figure 4:
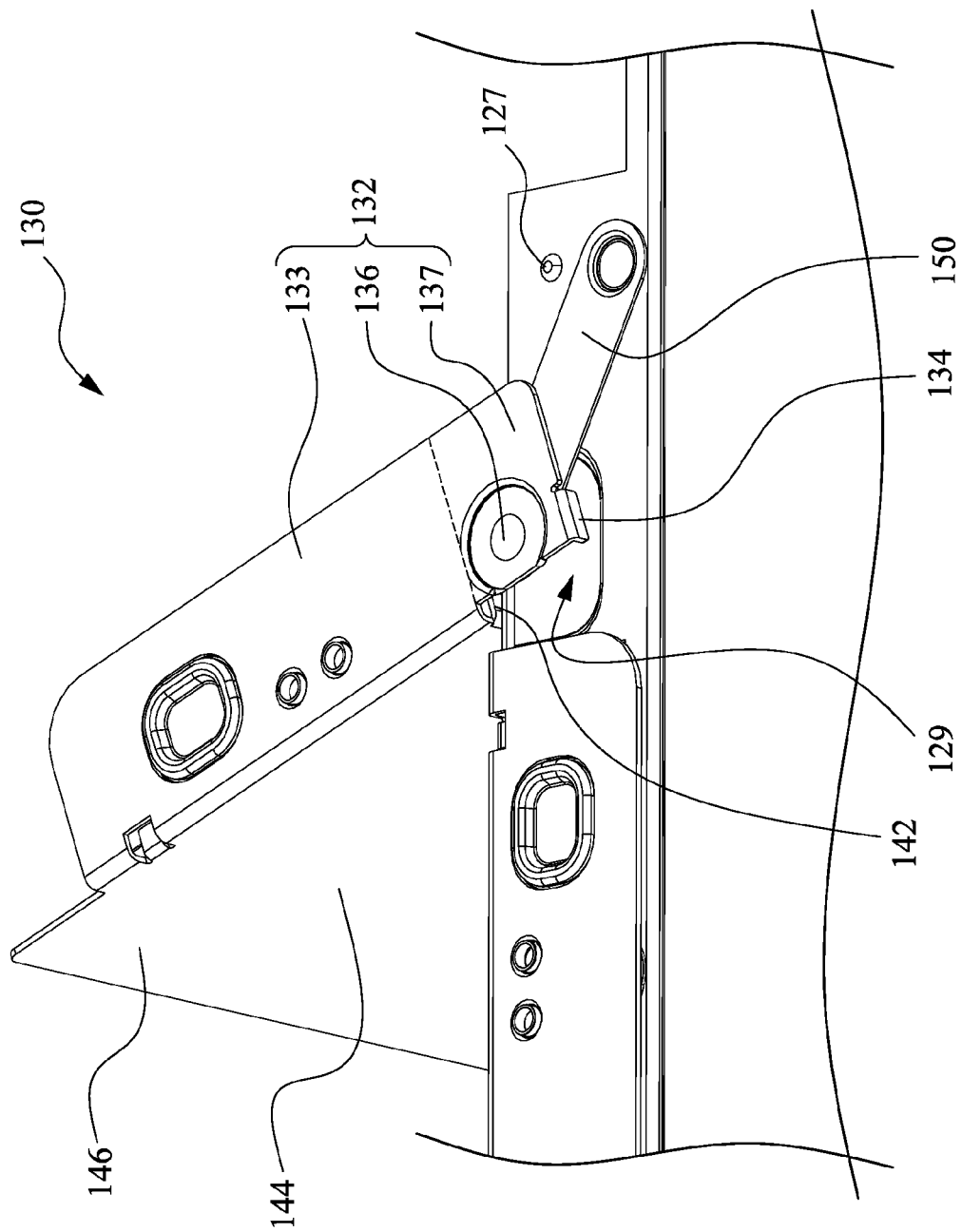
FIG. 4 is a bottom perspective view of the cabinet and the superstructure according to an embodiment of the present disclosure.

FIG. 4 is a bottom perspective view of the cabinet 120 and the superstructure 130 according to an embodiment of the present disclosure.

As shown in FIG. 3 and FIG. 4, the side board 132 includes a first stopping portion 134. During the superstructure 130 rotate relative to the corresponding connecting rod 150 and open a part of the opening 122, the first stopping portion 134 abuts against the connecting rod 150 to restrict a rotating angle of the superstructure 130 relative to the connecting rod 150. To be specific, when the top board 140 covers the opening 122, a first angle θ1 formed between the top board 140 and the connecting rod 150. When the top board 140 rotates relative to the connecting rod 150 until the first stopping portion 134 abuts against the connecting rod 150, a second angle θ2 is formed between the top board 140 and the connecting rod 150, and the second angle θ2 is greater than the first angle θ1. The top board 140 includes a second stopping portion 142. The second stopping portion 142 is capable of abutting against the cabinet 120 or the adjacent superstructure 130 so as to make the top board 140 erect relative to the opening 122.

Because the superstructure 130 can erect relative to the opening 122, the operator can lift the superstructure 130 without holding the superstructure 130 or laying the superstructure 130 to the adjacent superstructure 130. Therefore, the time of lifting the superstructure 130 is reduced, and it is more convenient to repair. When the operator need to exchange the last raw of the storage device 500 (see FIG. 1), and if the superstructure 130 cannot erect relative to the opening 122, the operator have to rotate the last raw of the superstructure 130 backward. The chassis 110 (see FIG. 1) restricts the superstructure 130 to lie down, and the superstructure 130 may slide forward to block a part of the opening 122. In comparison, the superstructure 130 in the present disclosure can erect so as to solve the problem.

The side board 132 includes a pivotal connecting part 137 and a first main part 133. The pivotal connecting part 137 is pivotally connected to the first end 152. The first stopping portion 134 is connected to the pivotal connecting part 137 and is bent relative to the pivotal connecting part 137 toward the cabinet 120. The first main part 133 is connected to the pivotal connecting part 137. The pivotal connecting part 137 is located between the first main part 133 and the first stopping portion 134. The top board 140 includes a second main part 144 and an extending part 146. The second main part 144 is connected to the first main part 133 and the second stopping portion 142. The second main part 144 is bent relative to the first main part 133. The extending part 146 is connected to the second main part 144. The second main part 144 is located between the second stopping portion 142 and the extending part 146. The pivotal connecting part 137 includes a pivot 136, and an axis of the pivot 136 is located between the first stopping portion 134 and the second stopping portion 142.

The first stopping portion 134 and the second stopping portion 142 are separated from two sides of the pivotal connecting part 137, and a notch 131 (see FIG. 3) is formed on the top board 140. The notch 131 allows the top board 140 leans more backward. Therefore, the superstructure 130 can discover the opening 122 more complete. The extending part 146 allows the notch 131 of the adjacent superstructure 130 be covered more complete by the top board 140.

The cabinet 120 includes an air intake port 128. A heat dissipation fan (not shown) in the cabinet 120 imports air into the air intake port 128 to cool the storage device 500 (see FIG. 1) and other devices of the cabinet 120. Because the superstructure 130 can be covered completely on the opening 122, the air flow in cabinet 120 can be leaded orderly by the heat dissipation fan so as to dissipate heat more effectively.

Furthermore, the cabinet 120 includes a containing groove 129 (see FIG. 4) disposed at the pivotal connecting part 137 to accommodate the pivot 136. Therefore, the pivot 136 does not need to extrude to avoid the cabinet 120. That is, the pivot 136 accommodated in the containing groove 129 can reduce the space of the server 100 (see FIG. 1). On the other hand, when the pivot 136 is accommodated in the containing groove 129, the cabinet 120 can be drawn out smoothly without being stocked by the pivot 136.

Figure 5:
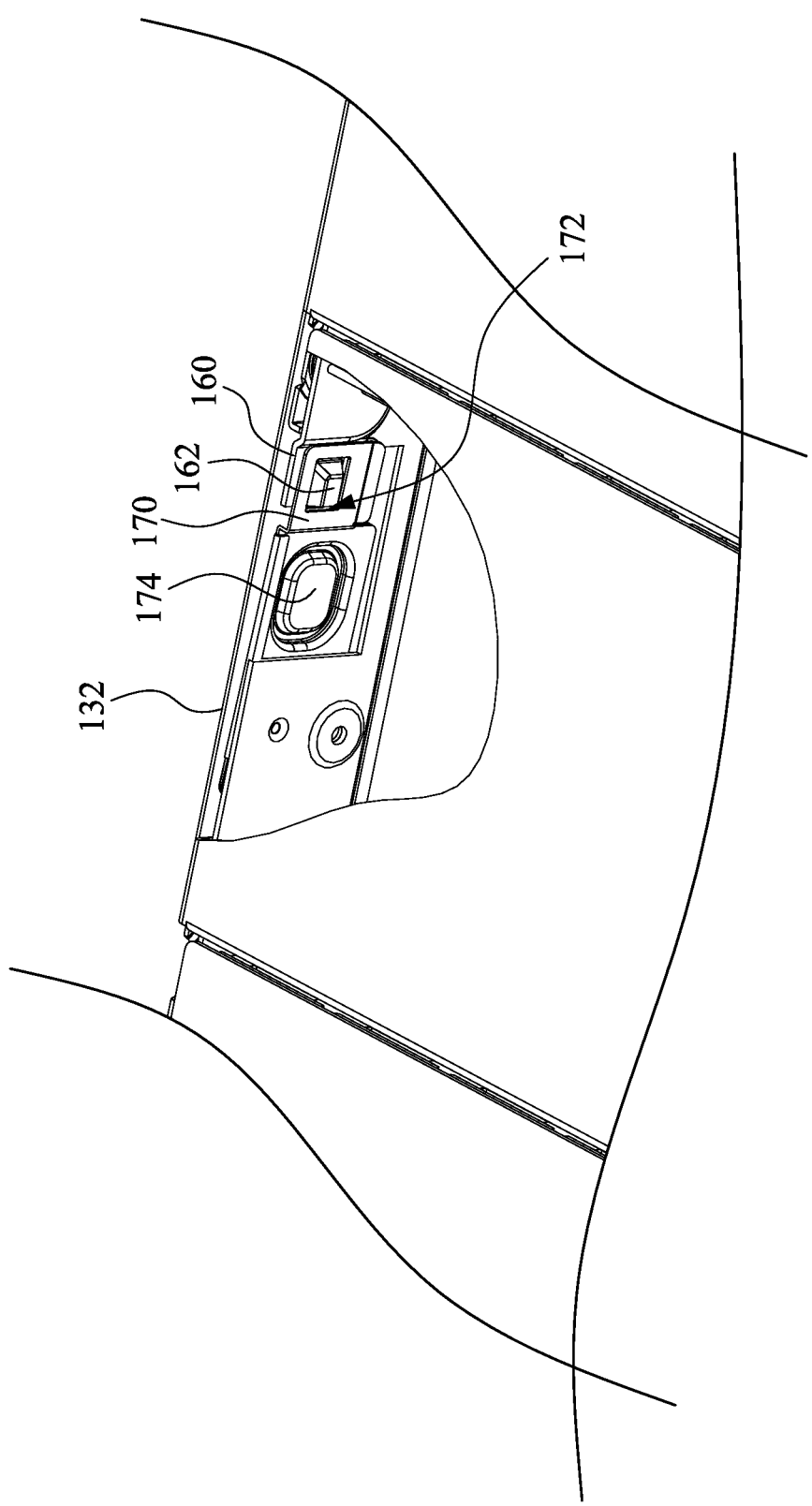
FIG. 5 is a schematic view of the cabinet and the superstructure.

FIG. 5 is a schematic view of the cabinet 120 and the superstructure 130.

As shown in FIG. 3 and FIG. 5, the server 100 (see FIG. 1) includes a plurality of first latches 160. Each of the first latches 160 is connected to the cabinet 120, and each of the superstructures 130 includes a second latch 170. When any one of the superstructures 130 covers a part of the opening 122, the second latch 170 and the corresponding first latch 160 are engaged to each other. When the second latch 170 is engaged to the corresponding first latch 160, the first latch 160 is located between the second latch 170 and the side board 132. Each of the first latches 160 includes a square shaped protrusion 162 extruding toward the accommodating space 112. Each of the second latches 170 has a square shaped locking groove 172 engaged to the square shaped protrusion 162.

When the cabinet 120 is transported, the second latch 170 engages to the corresponding first latch 160 to avoid the storage device 500 (see FIG. 1) being damaged or detached from the cabinet 120 because of vibration. In the present disclosure, the square shaped protrusion 162 and the square shaped locking groove 172 are square shaped for the shape can be engaged tighter.

People having ordinary skill in the art can make proper modification to the shape of the square shaped protrusion 162 and the square shaped locking groove 172 according to their actual needs.

Each of the second latches 170 includes a pressing portion 174. Each of the side board 132 has a pressing hole 138. The pressing portion 174 is located at the pressing hole 138. When the pressing portion 174 is pressed through the pressing hole 138, the second latch 170 moves away from the side board 132 and is disengaged from the first latch 160. The cabinet 120 has a groove 126. When the superstructure 130 covers a part of the opening 122 and the pressing portion 174 is pressed, at least a part of the pressing portion 174 passes through the groove 126 and moves into the receiving hole 124. Therefore, the receiving hole 124 provides a space for the pressing portion 174 to move smoothly while being pressed.

Accordingly, when an operator exchanges the storage device, the operator draws out the cabinet and lifts up the superstructures, and the storage device is ready to be exchanged. A conventional superstructure on a cabinet in a server is a metal sheet. The conventional superstructure is heavy, and the operator has to draw out the whole cabinet to take the superstructure out, which is inconvenient. In comparison to the conventional server, the server in the present disclosure is capable for the operator to exchange the storage device. The operator only need to draw out the cabinet to a position of the storage device located at, and lifts up the corresponding superstructures without drawing out the whole cabinet. Therefore, the present disclosure can save the time of repairing so as to minimize labor costs.

Furthermore, in the present disclosure, the thickness of the server is reduced to save space. By pivotally connecting the connecting rod to the superstructure and the cabinet, the fulcrum of the superstructure is moved down. If the fulcrum of superstructure extrudes out of the cabinet, the chassis is need to be larger. Therefore, utilizing the connecting rods to move down the fulcrum of the superstructures to the cabinet can save the space of the server.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A server, comprising: a chassis having an accommodating space; a cabinet slidably connected to the chassis so as to slide in or slide out the accommodating space, the cabinet having an opening and a receiving hole communicated to each other, wherein the receiving hole accommodates at least one storage device; a plurality of superstructures, each of the superstructures being rotatably connected to the cabinet so as to cover or open a part of the opening: and a plurality of first latches, wherein each of the first latches is connected to the cabinet, each of the superstructures further comprises a second latch, wherein, when any one of the superstructures covers a part of the opening, the second latch and the corresponding first latch are engaged to each other: and when the second latch is engaged to the corresponding first latch, the first latch is located between the second latch and a side board.

2. The server of claim 1, further comprising a plurality of connecting rods, wherein each of the connecting rods has a first end and a second end, and the first end and the second end are respectively pivotally connected to the corresponding superstructure and the cabinet.

3. The server of claim 2, wherein each of the superstructures comprises:
a side board pivotally connected to the first end of the corresponding connecting rod; and
a top board connected to the side board and bent relative to the side board so as to cover or open a part of the opening.

4. The server of claim 3, wherein the side board comprises a first stopping portion; when the top board covers the opening, a first angle formed between the top board and the connecting rod, and when the top board rotates relative to the connecting rod until the first stopping portion abuts against the connecting rod, a second angle is formed between the top board and the connecting rod; and the second angle is greater than the first angle.

5. The server of claim 4, wherein the top board comprises a second stopping portion, and the second stopping portion is capable of abutting against the cabinet or the adjacent superstructure so as to make the top board erect relative to the opening.

6. The server of claim 5, wherein the side board further comprises:
a pivotal connecting part pivotally connected to the first end, wherein the first stopping portion is connected to the pivotal connecting part and is bent relative to the pivotal connecting part toward the cabinet; and
a first main part connected to the pivotal connecting part, wherein the pivotal connecting part is located between the first main part and the first stopping portion.

7. The server of claim 6, wherein the top board further comprises:
a second main part connected to the first main part and the second stopping portion, the second main part being bent relative to the first main part; and
an extending part connected to the second main part, wherein the second main part is located between the second stopping portion and the extending part, the pivotal connecting part comprises a pivot, and an axis of the pivot is located between the first stopping portion and the second stopping portion.

8. The server of claim 1, wherein each of the first latches comprises a square shaped protrusion extruding toward the accommodating space, and each of the second latches has a square shaped locking groove engaged to the square shaped protrusion.

9. The server of claim 8, wherein each of the second latches comprises a pressing portion, each of the side board has a pressing hole, the pressing portion is located at the pressing hole, and, when the pressing portion is pressed through the pressing hole, the second latch moves away from the side board and is disengaged from the first latch.

10. The server of claim 9, wherein the cabinet has a groove, and, when the superstructure covers a part of the opening and the pressing portion is pressed, at least a part of the pressing portion passes through the groove and moves into the receiving hole.

* * * * *